United States Patent
Umeno et al.

(10) Patent No.: US 7,023,098 B2
(45) Date of Patent: Apr. 4, 2006

(54) RESIN COMPOSITION FOR ENCAPSULATING SEMICONDUCTOR CHIP AND SEMICONDUCTOR DEVICE THEREWITH

(75) Inventors: Kuniharu Umeno, Tochigi (JP); Shigehisa Ueda, Tochigi (JP)

(73) Assignee: Sumitomo Bakelite Company, Tokyo (JP)

( * ) Notice: Subject to any disclaimer, the term of this patent is extended or adjusted under 35 U.S.C. 154(b) by 127 days.

(21) Appl. No.: 10/797,706

(22) Filed: Mar. 10, 2004

(65) Prior Publication Data

US 2004/0217489 A1  Nov. 4, 2004

(30) Foreign Application Priority Data

| Mar. 11, 2003 | (JP) | 2003-064331 |
| Mar. 11, 2003 | (JP) | 2003-064332 |
| Mar. 17, 2003 | (JP) | 2003-072860 |
| Mar. 17, 2003 | (JP) | 2003-072861 |
| Jul. 30, 2003 | (JP) | 2003-203572 |
| Jul. 30, 2003 | (JP) | 2003-203573 |

(51) Int. Cl.
  *H01L 23/28* (2006.01)
(52) U.S. Cl. .................................... 257/787
(58) Field of Classification Search ............... 525/523, 525/370, 242, 119; 428/620, 413; 257/793, 257/788, 787

See application file for complete search history.

(56) References Cited

U.S. PATENT DOCUMENTS 6,376,101 B1 * 4/2002 Ota ........................... 428/620

FOREIGN PATENT DOCUMENTS

| JP | 01-245014 | 9/1989 |
| JP | 03-029352 | 2/1991 |
| JP | 07-090052 | 4/1995 |
| JP | 2001-131390 | 5/2001 |
| JP | 2002-322347 | 11/2002 |
| JP | 2003-105056 | 4/2003 |
| JP | 2003-292730 | 10/2003 |

* cited by examiner

*Primary Examiner*—Carl Whitehead, Jr.
*Assistant Examiner*—Monica D. Harrison
(74) *Attorney, Agent, or Firm*—Smith, Gambrell & Russell

(57) ABSTRACT

An epoxy resin composition for encapsulating a semiconductor chip, which has good flowability without deterioration in curability. Specifically, a resin composition for encapsulating a semiconductor chip containing an epoxy resin (A), a phenol resin (B), an inorganic filler (C) and a curing accelerator (D) as main components, and further containing a silane coupling agent (E) in 0.01 wt % to 1 wt % both inclusive of the total amount of the epoxy resin composition and Compound (F) contains two hydroxyl groups combined with each of adjacent carbon atoms in an aromatic ring in more than or equal to 0.01 wt % of the total amount of the epoxy resin composition.

14 Claims, 1 Drawing Sheet

RESIN COMPOSITION FOR ENCAPSULATING SEMICONDUCTOR CHIP AND SEMICONDUCTOR DEVICE THEREWITH

This application is based on Japanese patent application NO. 2003-064331, Japanese patent application NO. 2003-064332, Japanese patent application NO. 2003-072860, Japanese patent application NO. 2003-072861, Japanese patent application NO. 2003-203572, and Japanese patent application NO. 2003-203573, the content of which incorporated hereinto by reference.

BACKGROUND OF THE INVENTION

1. Field of the Invention

This invention relates to a resin composition for encapsulating a semiconductor chip and a semiconductor device therewith.

2. Description of the Related Art

Recently, epoxy resin compositions have been predominantly used for encapsulating a semiconductor chip because of their good balance among productivity, a cost and reliability. Along with reduction in a size and a thickness in a semiconductor device, an epoxy resin composition for encapsulating with a lower viscosity and higher strength has been needed. From such a situation, there has been recently a distinctive tendency to employing a less viscous resin and adding more inorganic fillers to an epoxy resin composition.

As a new trend, a semiconductor device has been more frequently mounted using an unleaded solder with a higher melting point than a conventional solder. For applying such a solder, a mounting temperature must be higher by about 20° C. than a conventional temperature, and thus a mounted semiconductor device becomes considerably less reliable than a device of the related art. Therefore, the need for improving reliability in a semiconductor device by providing a higher-level epoxy resin composition has increasingly become stronger, which further accelerates reducing a resin viscosity and increasing the amounts of inorganic fillers.

As well-known technique, a low viscosity and a high flowability during molding can be maintained by using a resin with a lower melt viscosity (see, Japanese Patent Application NO. 1995-130919 (pp. 2–5)) or by surface-processing inorganic fillers with a silane coupling agent for increasing the amounts of the inorganic fillers (see, Japanese Patent Application NO. 1996-20673 (pp. 2–4)).

However, any of these methods can meet only one of various needs and there have been no methods which are applicable to a wide range of applications by meeting all the needs. Since a melt viscosity during molding is insufficiently reduced according to any of the above methods, there has been needed more improved technique which can meet the requirements of the increased amounts of inorganic fillers and higher reliability without deterioration in flowability or curability.

SUMMARY OF THE INVENTION

In view of the situation, an objective of this invention is to provide technique whereby flowability can be improved without deterioration in curability in a resin composition for encapsulating a semiconductor chip during molding.

This invention provides a resin composition for encapsulating a semiconductor chip comprising: an epoxy resin (A); a phenol resin (B); an inorganic filler (C); a curing accelerator (D); a silane coupling agent (E); and Compound (F) containing two and more hydroxyl groups combined with each of adjacent carbon atoms comprising an aromatic ring.

The resin composition for encapsulating a semiconductor chip of this invention comprises Compound (F) as an essential component, so that sufficient curability and flowability can be ensured.

The resin composition for encapsulating a semiconductor chip of this invention may contain the epoxy resin (A), the phenol resin (B), the inorganic filler (C) and the curing accelerator (D) as main components.

The resin composition for encapsulating a semiconductor chip of this invention may comprise the compound (F) in more than or equal to 0.01 wt %, which may further improve flowability without deterioration in curability during molding.

The resin composition for encapsulating a semiconductor chip of this invention may comprise the silane coupling agent (E) in 0.01 wt % to 1 wt % both inclusive, which may further improve curability and flowability during molding.

In the resin composition for encapsulating a semiconductor chip of this invention, the epoxy resin (A) can comprise an epoxy resin represented by general formula (1) in 50 wt % or more.

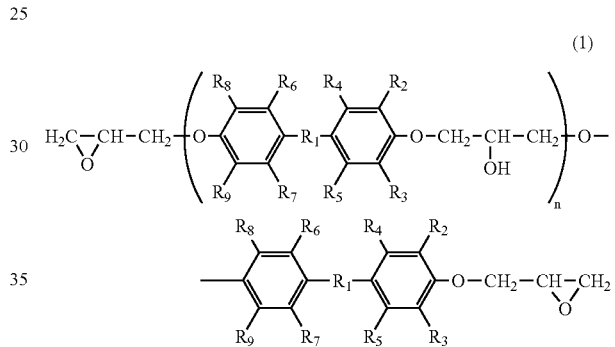

wherein $R_1$ represents a single bond or saturated or unsaturated hydrocarbon having up to three carbon atoms; $R_2$ to $R_9$, which may be the same or different from each other, represent hydrogen or saturated hydrocarbon having up to four carbon atoms; and n is a positive number more than 0 and up to 5 as an average.

The resin composition for encapsulating a semiconductor chip according to this invention may comprise the epoxy resin represented by general formula (1) in 50 wt % or more in the epoxy resin (A), and further Compound (F) as an essential component. Sufficient curability and flowability can be, therefore, ensured during molding.

In the resin composition for encapsulating a semiconductor chip of this invention, the compound (F) may contain two hydroxyl groups combined with each of adjacent carbon atoms comprising the aromatic ring, which may allow curability and flowability to be suitably ensured during molding.

In the resin composition for encapsulating a semiconductor chip of this invention, the aromatic ring may be a naphthalene ring, which may further improve curability and flowability during molding.

In the resin composition for encapsulating a semiconductor chip of this invention, the compound (F) may contain two hydroxyl groups combined with each of adjacent carbon atoms comprising the naphthalene ring, which may further improve balance between curability and flowability during molding.

The resin composition for encapsulating a semiconductor of chip this invention may comprise an inorganic filler (C) in 80 wt % to 94 wt % both inclusive, ensuring that the resin composition can be less viscous and stronger.

This invention also provides a semiconductor device wherein a semiconductor chip is encapsulated by the use of the resin composition for encapsulating a semiconductor chip described above. Since the semiconductor device according to this invention is encapsulated by the resin composition for encapsulating a semiconductor chip, production stability can be adequately secured.

As described above, this invention can provide a resin composition for encapsulating a semiconductor chip having good flowability during molding while maintaining curability by using an epoxy resin composition comprising a compound containing two and more hydroxyl groups combined with each of adjacent carbon atoms comprising an aromatic ring.

BRIEF DESCRIPTION OF THE DRAWINGS

The above and the objectives, features and advantages of this invention will become apparent with reference to the following preferred embodiments and the accompanying drawing.

DETAILED DESCRIPTION OF THE INVENTION

Figure 1:
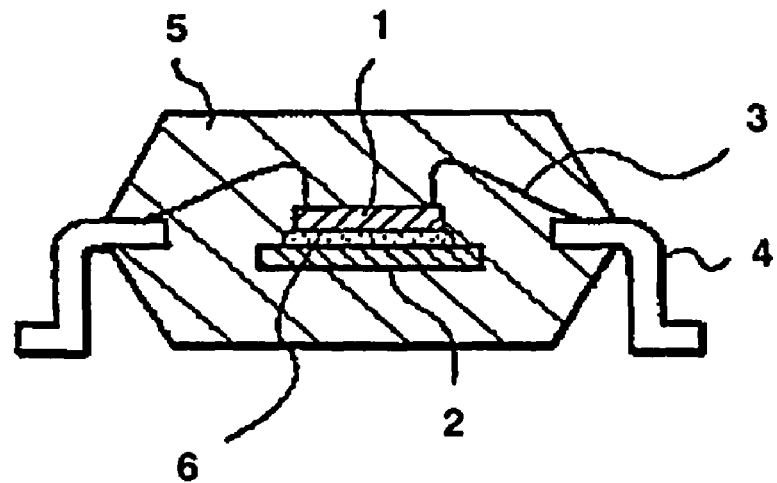
FIG. 1 is a cross-sectional view showing a structural example of a semiconductor device according to an embodiment of this invention.

A resin composition according to this invention comprises
an epoxy resin (A),
a phenol resin (B),
an inorganic filler (C),
a curing accelerator (D),
a silane coupling agent (E) and
Compound (F) containing two and more hydroxyl groups combined with each of adjacent carbon atoms comprising an aromatic ring, as essential components.

An epoxy resin composition of the present invention can contain each component as follows:
(A): 1 to 40% weight.
(B): 1 to 40% weight.
(C): 40 to 97% weight.
(D): 0.001 to 5% weight.
(E): 0.01 to 1% weight.
(F): 0.01 to 1% weight.

There will be described each component constituting the epoxy resin component for encapsulating a semiconductor chip according to this invention.

Examples of an epoxy resin (A) include, but not limited to, phenol novolac type epoxy resins, cresol novolac type epoxy resins, biphenyl type epoxy resins, bisphenol type epoxy resins, stilbene type epoxy resins, triphenolmethane type epoxy resins, phenolaralkyl (including a phenylene or biphenylene structure) type epoxy resins, naphthol type epoxy resins, alkyl-modified triphenolmethane type epoxy resins, triazine-structure containing type epoxy resins, and dicyclopentadiene-modified phenol type epoxy resins, which may be used alone or in combination of two or more.

In the light of moisture-resistance reliability as an epoxy resin composition for encapsulating a semiconductor chip, it is preferable that Na and Cl ions as ionic impurities exit as little as possible. In view of curability, an epoxy equivalent may be, for example, 100 g/eq to 500 g/eq both inclusive.

The epoxy resin (A) may comprise an epoxy resin represented by general formula (1) in 50 wt % or more. Examples of the epoxy resin represented by general formula (1) include biphenyl type epoxy resins, bisphenol type epoxy resins and stilbene type epoxy resins.

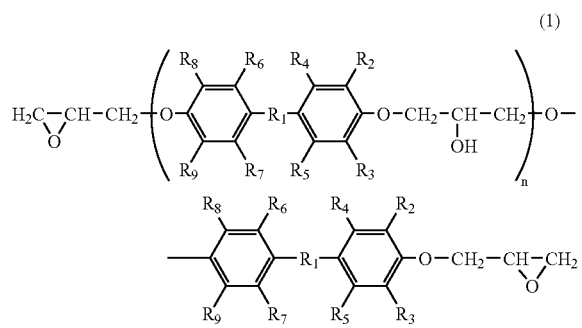

(1)

In the general formula (1), $R_1$ represents a single bond or saturated or unsaturated hydrocarbon having up to three carbon atoms; $R_2$ to $R_9$, which may be the same or different from each other, represent hydrogen or saturated hydrocarbon having up to four carbon atoms; and n is a positive number more than 0 and up to 5 as an average.

It may be combined with another resin such as phenol novolac type epoxy resins, cresol novolac type epoxy resins, triphenolmethane type epoxy resins, phenolaralkyl (including a phenylene or biphenylene structure) type epoxy resins, naphthol type epoxy resins, alkyl-modified triphenolmethane type epoxy resins, triazine-structure containing type epoxy resins, and dicyclopentadiene-modified phenol type epoxy resins.

Since any of the epoxy resin represented by general formula (1) has a lower melt viscosity, it can be increasing the amounts of the inorganic fillers. Consequently, the resin composition applied the epoxy resin represented by general formula (1) for encapsulating a semiconductor chip may improve moldability and solder resistance in a semiconductor device.

Examples of the phenol resin (B) include, but not limited to, phenol novolac resins, cresol novolac resins, triphenolmethane resins, terpene-modified phenol resins, dicyclopentadiene-modified phenol resins, phenolaralkyl resins (including a phenylene or biphenylene structure), naphtholaralkyl resins (including a phenylene or biphenylene structure), which can be used alone or in combination of two or more. In the light of curability, a hydroxyl equivalent may be, for example, preferably 90 g/eq to 250 g/eq both inclusive.

Examples of an inorganic filler (C) generally include fused silica, spherical silica, crystal silica, alumina, silicon nitride and aluminum nitride, which are commonly used for an encapsulating material. A particle size of the inorganic filler may be 0.01 μM to 150 μm both inclusive in the light of filling properties into a mold.

A filling amount of the inorganic filler (C) may be, for example, 80 wt % or more, preferably 86 wt % or more of the total amount of an epoxy resin composition. Applying the epoxy resin (A) comprising the epoxy resin represented by general formula (1) in 50 wt % or more, a filling amount of the inorganic filler (C) may be, for example, 88 wt % or more of the total amount of an epoxy resin composition. If a filling amount is too low, water absorption by a cured product of the epoxy resin composition may be increased, leading to deterioration in strength and thus insufficient solder resistance.

On the other hand, a filling amount of the inorganic filler (C) may be, for example, 94 wt % or less of the total amount of the epoxy resin composition. If it is too high, flowability may be deteriorated, leading to deterioration in moldability.

The curing accelerator (D) may be any compound which can accelerate a reaction between an epoxy group in an epoxy resin and a hydroxyl group in a phenol resin, and may be selected from those commonly used in an epoxy resin composition as an encapsulating resin for a semiconductor chip. Specific examples include phosphorous-containing compounds such as organophosphines, tetra-substituted phosphonium compounds and phosphobetaine compounds; and nitrogen-containing compounds such as 1,8-diazabicyclo(5,4,0)undecene-7, benzyldimethylamine and 2-methylimidazole.

Examples of an organophosphine include primary phosphines such as ethylphosphine and phenylphosphine; secondary phosphines such as dimethylphosphine and diphenylphosphine; tertiary phosphines such as trimethylphosphine, triethylphosphine, tributylphosphine, and triphenylphosphine.

A tetra-substituted phosphonium compound may be a compound represented by general formula (2):

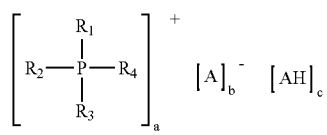

(2)

wherein P is phosphorous; $R_1$, $R_2$, $R_3$ and $R_4$ are substituted or unsubstituted aromatic or alkyl; A is an anion of an aromatic organic acid having a functional group selected from hydroxyl, carboxyl and thiol in the aromatic ring; AH is an aromatic organic acid having at least one selected from hydroxyl, carboxyl and thiol in the aromatic ring; a and b are an integer of 1 to 3 both inclusive; and c is an integer of 0 to 3 both inclusive, provided that a=b.

The compound represented by general formula (2) may be prepared as follows. First, a tetra-substituted phosphonium bromide, an aromatic organic acid and a base are combined in an organic solvent and homogeneously mixed to generate aromatic organic acid anions in the solution system. Then, by adding water, the compound represented by general formula (2) may be precipitated.

A preferable compound represented by general formula (2) is a compound wherein $R_1$, $R_2$, $R_3$ and $R_4$ bound to phosphorous are phenyl; AH is a compound having a hydroxyl group in an aromatic ring, that is, phenols; and A is preferably an anion of the phenols.

A phosphobetaine compound may be a compound represented by general formula (3):

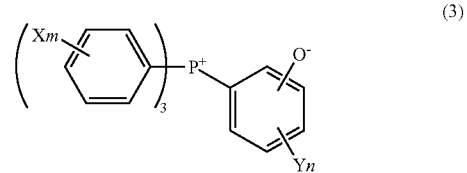

(3)

wherein X is hydrogen or alkyl having 1 to 3 carbon atoms both inclusive; Y is hydrogen or hydroxyl; m and n are an integer of 1 to 3 both inclusive.

The compound represented by general formula (3) may be prepared as follows. First, an iodophenol and a triaromatic-substituted phosphine are homogeneously mixed in an organic solvent and by using a nickel catalyst, a product is precipitated as an iodonium salt. The iodonium salt and a base may be homogeneously mixed in an organic solvent and water may be, if necessary, added to precipitate the compound represented by general formula (3).

The compound represented by general formula (3) may be selected from, but not limited to, those wherein X is hydrogen or methyl, and Y is hydrogen or hydroxyl, which may be used alone or in combination of two or more.

An amount of the curing accelerator (D) may be 0.1 wt % to 1 wt % both inclusive, preferably 0.1 wt % to 0.6 wt % both inclusive of the total amount of an epoxy resin composition. If the amount of the curing accelerator (D) is too low, desired level of curability may not be obtained, while if too high, flowability may be deteriorated.

The silane coupling agent (E) may be selected from epoxysilanes, aminosilanes, ureidosilanes and mercaptosilanes. However, it may be, without limitations, any one which can be reacted between an epoxy resin composition and an inorganic filler to improve interface strength between the epoxy resin composition and the inorganic filler.

Compound (F) containing two and more hydroxyl groups combined with each of adjacent carbon atoms comprising an aromatic ring (hereinafter, referred to as "Compound (F)") significantly improves viscosity and flow properties by synergistic effect with a silane coupling agent (E). The silane coupling agent (E) is essential for adequate effects of Compound (F).

These silane coupling agents (E) may be used alone or in combination of two or more. An amount of the silane coupling agent (E) may be 0.01 wt % to 1 wt % both inclusive, preferably 0.05 wt % to 0.8 wt % both inclusive, more preferably 0.1 wt % to 0.6 wt % both inclusive of the total amount of an epoxy resin composition. If the amount is too low, Compound (F) may not be adequately effective and solder resistance of a semiconductor package may be deteriorated. If too high, an epoxy resin composition becomes so water-absorptive that solder resistance in a semiconductor package may be also deteriorated.

Compound(F) containing two and more hydroxyl groups combined with each of adjacent carbon atoms comprising an aromatic ring may contain optionally a substituent other than the hydroxyl groups. Compound (F) may be a monocyclic compound represented by general formula (4):

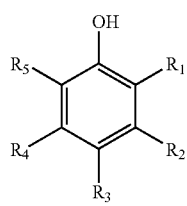

(4)

wherein one of $R_1$ and $R_5$ is hydroxyl and the other is hydrogen, hydroxyl or a substituent other than hydroxyl; and $R_2$, $R_3$ and $R_4$ are hydrogen, hydroxyl or a substituent other than hydroxyl; or a polyclic compound represented by general formula (5):

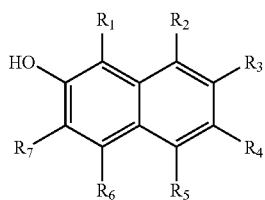

(5)

wherein one of $R_1$ and $R_7$ is hydroxyl and the other is hydrogen, hydroxyl or a substituent other than hydroxl; and $R_2$, $R_3$, $R_4$, $R_5$ and $R_6$ are hydrogen, hydroxyl or a substituent other than hydroxyl.

Examples of the monocyclic compound represented by general formula (4) include catechol, pyrogallol, gallic acid, gallic acid esters, and their derivatives. Examples of the polycyclic compound represented by general formula (5) include 1,2-dihydroxynaphthalene, 2,3-dihydroxynaphthalene and their derivatives.

In particular, the above compound preferably has two hydroxyl groups combined with each of adjacent carbon atoms comprising an aromatic ring for flowability and easy control to curability. In the light of volatilization during a kneading process, a core ring may be preferably a naphthalene ring which contributes to lower volatility and weighing stability.

Compound (F) may be, for example, a naphthalene-containing compound such as 1,2-dihydroxynaphthalene, 2,3-dihydroxynaphthalene and their derivatives. Such a compound may be used to further improve controllability in handling an epoxy resin composition and to reduce volatility of the epoxy resin composition.

The compounds as Compound (F) may be used in combination of two or more.

An amount of Compound (F) may be 0.01 wt % to 1 wt % both inclusive, preferably 0.03 wt % to 0.8 wt % both inclusive, more preferably 0.05 wt % to 0.5 wt % both inclusive of the total amount of an epoxy resin composition. When using an epoxy resin represented by general formula (1) in 50 wt % or more, an amount of Compound (F) may be 0.01 wt % to 0.3 wt % both inclusive of the total amount of an epoxy resin composition. If the amount is too low, expected viscosity or flow properties by synergetic effect with a silane coupling agent (E) may not be obtained, while if too high, curing of the epoxy resin composition may be inhibited, leading to deteriorated physical properties of a cured product and thus deterioration in its performance as a resin for encapsulating a semiconductor chip.

Although an epoxy resin composition according to this invention comprises the above components (A) to (F) as essential components, it may further contain, if necessary, additives including a fire retardant such as a brominated epoxy resin and antimony trioxide; a mold release; a coloring agent such as carbon black; a low-stress additive such as silicone oil and silicone rubber; and an inorganic ion exchanger as appropriate.

An epoxy resin composition according to this invention may be prepared by homogeneously mixing components (A) to (F) and other additives in a mixer at an ambient temperature, followed by melt-kneading using an appropriate apparatus such as a heating roller, kneader or extruder, cooling and then grinding.

For encapsulating a semiconductor chip using an epoxy resin composition according to this invention to provide a semiconductor device, the composition may be molded and cured by an appropriate molding process such as transfer molding, compression molding and injection molding.

An epoxy resin composition according to this invention may be suitably used for encapsulating a variety of semiconductor chips. It may be used, for example, as an encapsulating resin for a surface mounting type semiconductor device such as QFP (quad flat package) and TSOP (thin small outline package). FIG. 1 is a cross-sectional view illustrating a structural example of a semiconductor device produced using an epoxy resin composition according to this invention. A semiconductor chip 1 is fixed on a die pad 2 via a cured die bonding material 6. Gold wires 3 couple the semiconductor chip 1 to lead frames 4. The semiconductor chip 1 is encapsulated with an encapsulating resin 5.

The semiconductor device shown in FIG. 1 may be prepared by molding and curing the above epoxy resin composition as the encapsulating resin 5 by an appropriate process such as transfer molding, compression molding and injection molding and then encapsulating the semiconductor chip 1.

Since the semiconductor device shown in FIG. 1 is encapsulated by an encapsulating resin composition comprising Compound (F) containing two and more hydroxyl groups combined with each of adjacent carbon atoms comprising an aromatic ring, suitable viscosity and flow properties of the encapsulating resin composition may be achieved. Thus, a semiconductor device with good moldability can be consistently provided.

By encapsulating the semiconductor chip using an epoxy resin composition comprising an epoxy resin represented by general formula (1), a semiconductor device with further excellent moldability and solder resistance can be more consistently provided.

This invention will be more specifically described with reference to, but not limited to, Examples. Throughout this disclosure, a blending ratio is presented as parts by weight.

EXAMPLE 1

A biphenyl type epoxy resin (Japan Epoxy Resin Inc., YX4000, epoxy equivalent: 195, "n" in formula (1) is 0 (zero) as an average, melting point: 105° C.): 6.9 wt parts;

a phenolaralkyl resin (Mitsui Chemical Inc., XLC-LL, hydroxyl equivalent: 174, softening point: 79° C.): 6.05 wt parts;

spherical fused silica (average particle size: 30 μm): 86.0 wt parts;

γ-Glycidylpropyl-trimethoxysilane: 0.6 wt parts;

triphenyl phosphine: 0.2 wt parts;

2,3-dihydroxynaphthalene (Reagent grade): 0.05 wt parts;

carnauba wax: 0.2 wt parts; and carbon black: 0.3 wt parts were mixed in a mixer at an ambient temperature, followed by melt kneading by a heating roller at 80 to 100° C., cooling and then grinding to obtain an epoxy resin composition. The resultant epoxy resin composition was evaluated as follows. The evaluation results are shown in Table 1.

Spiral flow; the epoxy resin composition was molded by a low-pressure transfer molding machine under the conditions of a temperature: 175° C., a molding pressure: 6.9 MPa and a pressure keeping time: 120 sec, using a mold in accordance with EMMI-1-66, and then a spiral flow was determined. A spiral flow is a parameter for flowability. The larger the parameter is, the better flowability is. A unit is "cm".

Curing torque ratio: Using a curastometer (Orientec Inc., JSR Curastometer Type IVPS), a torque was determined 90 and 300 sec after initiation of heating at a mold temperature of 175° C. and a curing torque ratio=(torque after 90 sec)/(torque after 300 sec) was calculated. A torque determined by a curastometer is a parameter for thermal rigidity. The larger the curing torque ratio is, the better curability is. A unit is "%".

Adhesion strength: test pieces for adhesion strength with the dimension of 2 cm×2 cm×2 cm were molded on a lead frame under the conditions of a mold temperature: 175° C., an injection pressure: 9.8 MPa and a curing time: 120 sec using a transfer molding machine. The lead frame was a copper frame plated with silver. Then, using an automatic shear strength meter (DAGE Inc., PC2400), a shear strength was determined for a cured product of the epoxy resin composition and the frame in N/mm².

EXAMPLES 2 TO 10 AND COMPARATIVE EXAMPLES 1 to 13

According to the blending ratios shown in Tables 1 and 2, epoxy resin compositions were prepared and evaluated as described in Example 1. The evaluation results are shown in Tables 1 and 2.

EXAMPLES 11 TO 23 AND COMPARATIVE EXAMPLES 14 TO 23

According to the blending ratios shown in Tables 3 and 4, epoxy resin compositions were prepared as described in Example 1 and evaluated as follows. The evaluation results are shown in Tables 3 and 4.

Spiral flow: determined as described in Example 1.

Curing torque ratio: determined as described in Example 1.

Solder resistance-reflow cracking: using a low-pressure transfer molding machine, a 80pQFP frame (Cu frame) with a body size of 14×20×2.7 mm to which an Si chip with a size of 7×7×0.35 mm is adhered was molded under the conditions of a mold temperature: 175° C., an injection time: 10 sec, a curing time: 90 sec and an injection pressure: 9.8 MPa. After post-curing at 175° C. for 8 hrs, it was humidified under the condition of 85° C. and 85% for 168 hrs and passed through an IR reflow at a peak temperature of 260° C. consecutive three times (three times, 10 sec at 255° C. or higher for each run). Then, it was examined for internal cracks and delaminations using an ultrasonic test equipment. Evaluation was based on the numbers of delaminations between the chip and the encapsulating resin and internal cracks in 10 packages.

Fire retardancy: using a low-pressure transfer molding machine, test pieces for fire retardancy with a thickness of 3.2 mm were prepared under the conditions of a mold temperature: 175° C., an injection time: 15 sec, a curing time: 120 sec, and an injection pressure: 9.8 MPa and was tested for fire retardancy in accordance with the specification of UL94.

Components used other than those in Example 1 are as follows.

a bisphenol A type epoxy resin (Japan Epoxy Resin Inc., epoxy equivalent: 172, "n" in formula (1) is 0 (zero) as an average, a melt viscosity at 25° C.: 45 mPa.sec);

a cresol novolac type epoxy resin (Nippon Kayaku Co., Ltd., EOCN 1020-55, epoxy equivalent: 198, softening point: 55° C.);

phenol novolac resin (hydroxyl equivalent: 104, softening point: 80° C.);

phenol biphenylaralkyl resin (Meiwa Kasei Co., Ltd., MEH-7851SS, hydroxyl equivalent 203, softening point: 65° C.);

γ-mercaptopropyltrimethoxysilane;

1,8-diazabicyclo(5,4,0)undecene-7 (hereinafter, referred to as "DBU");

a curing accelerator represented by formula (6);

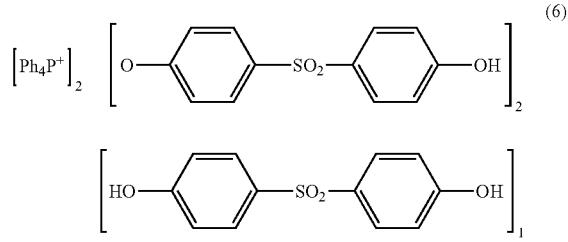

(6)

a curing accelerator represented by formula (7);

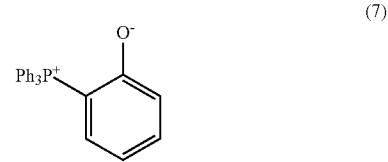

(7)

1,2-dihydroxynaphthalene (Reagent grade);
catechol (Reagent grade);
pyrogallol (Reagent grade);
1,6-dihydroxynaphthalene (Reagent grade); and
resorcinol (Reagent grade).

TABLE 1

|  | Example | | | | | | | | | |
| --- | --- | --- | --- | --- | --- | --- | --- | --- | --- | --- |
|  | 1 | 2 | 3 | 4 | 5 | 6 | 7 | 8 | 9 | 10 |
| Biphenyl type epoxy resin | 6.9 | 7.0 | 7.2 | 7.0 | 7.0 | 7.1 | 7.2 | 7.0 | 7.1 | 7.0 |
| Phenolaralkyl resin | 6.05 | 5.8 | 5.3 | 5.8 | 5.8 | 5.7 | 5.6 | 5.8 | 5.6 | 5.8 |
| Spherical fused silica | 86.0 | 86.0 | 86.0 | 86.0 | 86.0 | 86.0 | 86.0 | 86.0 | 86.0 | 86.0 |
| γ-Glycidylpropyltrimethoxysilane | 0.6 | 0.3 | 0.1 |  | 0.3 | 0.3 | 0.3 | 0.3 | 0.3 | 0.3 |
| γ-Mercaptopropyltrimethoxysilane |  |  |  | 0.3 |  |  |  |  |  |  |

TABLE 1-continued

|  | Example |  |  |  |  |  |  |  |  |  |
|---|---|---|---|---|---|---|---|---|---|---|
|  | 1 | 2 | 3 | 4 | 5 | 6 | 7 | 8 | 9 | 10 |
| Triphenylphosphine | 0.2 | 0.2 | 0.2 | 0.2 | 0.2 | 0.2 | 0.2 |  |  |  |
| DBU |  |  |  |  |  |  |  | 0.2 |  |  |
| Curing accelerator of formula (6) |  |  |  |  |  |  |  |  | 0.3 |  |
| Curing accelerator of formula (7) |  |  |  |  |  |  |  |  |  | 0.2 |
| 2,3-Dihydroxynaphthalene | 0.05 | 0.2 | 0.5 | 0.2 |  |  |  | 0.2 | 0.2 | 0.2 |
| 1,2-Dihydroxynaphthalene |  |  |  |  | 0.2 |  |  |  |  |  |
| Catechol |  |  |  |  |  | 0.2 |  |  |  |  |
| Pyrogallol |  |  |  |  |  |  | 0.2 |  |  |  |
| 1,6-Dihydroxynaphthalene |  |  |  |  |  |  |  |  |  |  |
| Resorcinol |  |  |  |  |  |  |  |  |  |  |
| Carnauba wax | 0.2 | 0.2 | 0.2 | 0.2 | 0.2 | 0.2 | 0.2 | 0.2 | 0.2 | 0.2 |
| Carbon black | 0.3 | 0.3 | 0.3 | 0.3 | 0.3 | 0.3 | 0.3 | 0.3 | 0.3 | 0.3 |
| Spiral flow (cm) | 133 | 126 | 120 | 130 | 124 | 105 | 127 | 121 | 132 | 128 |
| Curing torque ratio (%) | 63 | 65 | 63 | 65 | 66 | 66 | 61 | 65 | 89 | 89 |
| Adhesion strength (N/mm$^2$) | 7.2 | 8.3 | 7.9 | 9.4 | 8.0 | 7.9 | 8.2 | 8.1 | 8.4 | 8.1 |

TABLE 2

|  | Comparative Example |  |  |  |  |  |  |  |  |  |  |  |  |
|---|---|---|---|---|---|---|---|---|---|---|---|---|---|
|  | 1 | 2 | 3 | 4 | 5 | 6 | 7 | 8 | 9 | 10 | 11 | 12 | 13 |
| Biphenyl type epoxy resin | 6.7 | 6.9 | 7.0 | 6.9 | 6.9 | 7.7 | 6.9 | 7.0 | 7.0 | 7.1 | 6.9 | 6.9 | 6.9 |
| Phenolaralkyl resin | 6.0 | 6.1 | 6.2 | 6.1 | 6.1 | 4.0 | 6.1 | 5.8 | 5.8 | 5.7 | 6.1 | 6.0 | 6.1 |
| Spherical fused silica | 86.0 | 86.0 | 86.0 | 86.0 | 86.0 | 86.0 | 86.0 | 86.0 | 86.0 | 86.0 | 86.0 | 86.0 | 86.0 |
| γ-Glycidylpropyltrimethoxysilane | 0.6 | 0.3 | 0.1 |  | 0.3 | 0.3 |  | 0.3 | 0.3 | 0.3 | 0.3 | 0.3 | 0.3 |
| γ-Mercaptopropyltrimethoxysilane |  |  |  | 0.3 |  |  |  |  |  |  |  |  |  |
| Triphenylphosphine | 0.2 | 0.2 | 0.2 | 0.2 | 0.2 | 0.2 | 0.2 | 0.2 | 0.2 | 0.2 |  |  |  |
| DBU |  |  |  |  |  |  |  |  |  |  | 0.2 |  |  |
| Curing accelerator of formula (6) |  |  |  |  |  |  |  |  |  |  |  | 0.3 |  |
| Curing accelerator of formula (7) |  |  |  |  |  |  |  |  |  |  |  |  | 0.2 |
| 2,3-Dihydroxynaphthalene |  |  |  |  | 0.008 | 1.3 |  | 0.2 |  |  |  |  |  |
| 1,2-Dihydroxynaphthalene |  |  |  |  |  |  |  |  |  |  |  |  |  |
| Catechol |  |  |  |  |  |  |  |  |  |  |  |  |  |
| Pyrogallol |  |  |  |  |  |  |  |  |  |  |  |  |  |
| 1,6-Dihydroxynaphthalene |  |  |  |  |  |  |  |  | 0.2 |  |  |  |  |
| Resorcinol |  |  |  |  |  |  |  |  |  | 0.2 |  |  |  |
| Carnauba wax | 0.2 | 0.2 | 0.2 | 0.2 | 0.2 | 0.2 | 0.2 | 0.2 | 0.2 | 0.2 | 0.2 | 0.2 | 0.2 |
| Carbon black | 0.3 | 0.3 | 0.3 | 0.3 | 0.3 | 0.3 | 0.3 | 0.3 | 0.3 | 0.3 | 0.3 | 0.3 | 0.3 |
| Spiral flow (cm) | 102 | 85 | 79 | 91 | 86 | 158 | 85 | 86 | 86 | 87 | 81 | 96 | 89 |
| Curing torque ratio (%) | 63 | 66 | 66 | 66 | 66 | 35 | 63 | 62 | 66 | 65 | 65 | 89 | 90 |
| Adhesion strength (N/mm$^2$) | 7.0 | 5.5 | 5.7 | 6.3 | 7.2 | 6.6 | 3.1 | 4.6 | 5.4 | 5.5 | 5.2 | 5.7 | 5.2 |

TABLE 3

|  | Example |  |  |  |  |  |  |  |  |  |  |  |  |
|---|---|---|---|---|---|---|---|---|---|---|---|---|---|
|  | 11 | 12 | 13 | 14 | 15 | 16 | 17 | 18 | 19 | 20 | 21 | 22 | 23 |
| Biphenyl type epoxy resin | 4.75 | 2.45 |  | 5.45 | 4.78 | 4.45 | 4.75 | 4.75 | 4.75 | 4.75 | 4.75 | 4.73 | 4.73 |
| Bisphenol A type epoxy resin |  |  | 3.40 |  |  |  |  |  |  |  |  |  |  |
| Cresol novolac type epoxy resin |  | 2.44 |  |  |  |  |  |  |  |  |  |  |  |
| Phenolaralkyl resin | 4.25 | 4.17 |  |  | 4.22 | 3.98 | 4.25 | 4.25 | 4.25 | 4.25 | 4.25 | 4.22 | 4.22 |
| Phenol novolac resin |  |  | 1.96 |  |  |  |  |  |  |  |  |  |  |
| Phenol biphenylaralkyl resin |  |  |  | 5.55 |  |  |  |  |  |  |  |  |  |
| Spherical fused silica | 90.00 | 90.00 | 93.50 | 88.00 | 90.00 | 90.00 | 90.00 | 90.00 | 90.00 | 90.00 | 90.00 | 90.00 | 90.00 |
| γ-Glycidylpropyltrimethoxysilane | 0.30 | 0.30 | 0.50 | 0.20 | 0.05 | 0.85 | 0.30 | 0.30 | 0.30 |  | 0.30 | 0.30 | 0.30 |
| γ-Mercaptopropyltrimethoxysilane |  |  |  |  |  |  |  |  |  | 0.30 |  |  |  |
| Triphenylphosphine | 0.15 | 0.10 | 0.12 | 0.20 | 0.20 | 0.20 | 0.15 | 0.15 | 0.15 | 0.15 |  |  |  |
| DBU |  |  |  |  |  |  |  |  |  |  | 0.15 |  |  |
| Curing accelerator of formula (6) |  |  |  |  |  |  |  |  |  |  |  | 0.20 |  |
| Curing accelerator of formula (7) |  |  |  |  |  |  |  |  |  |  |  |  | 0.20 |
| 2,3-Dihydroxynaphthalene | 0.05 | 0.04 | 0.02 | 0.10 | 0.25 | 0.02 |  |  |  | 0.05 | 0.05 | 0.05 | 0.05 |
| 1,2-Dihydroxynaphthalene |  |  |  |  |  |  | 0.05 |  |  |  |  |  |  |
| Catechol |  |  |  |  |  |  |  | 0.05 |  |  |  |  |  |
| Pyrogallol |  |  |  |  |  |  |  |  | 0.05 |  |  |  |  |
| 1,6-Dihydroxynaphthalene |  |  |  |  |  |  |  |  |  |  |  |  |  |
| Resorcinol |  |  |  |  |  |  |  |  |  |  |  |  |  |
| Carnauba wax | 0.20 | 0.20 | 0.20 | 0.20 | 0.20 | 0.20 | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 | 0.30 | 0.30 | 0.30 | 0.30 | 0.30 | 0.30 |

TABLE 3-continued

| | Example | | | | | | | | | | | | |
|---|---|---|---|---|---|---|---|---|---|---|---|---|
| | 11 | 12 | 13 | 14 | 15 | 16 | 17 | 18 | 19 | 20 | 21 | 22 | 23 |
| Spiral flow (cm) | 100 | 98 | 73 | 102 | 110 | 95 | 102 | 82 | 115 | 105 | 98 | 121 | 105 |
| Curing torque ratio (%) | 63 | 61 | 65 | 58 | 60 | 65 | 61 | 60 | 59 | 62 | 58 | 94 | 88 |
| Solder resistance-cracking  Chip delamination | 0 | 0 | 0 | 0 | 0 | 0 | 0 | 0 | 0 | 0 | 0 | 0 | 0 |
| Internal crack | 0 | 0 | 0 | 0 | 0 | 0 | 0 | 0 | 0 | 0 | 0 | 0 | 0 |
| Fire retardancy | V-O | V-O | V-O | V-O | V-O | V-O | V-O | V-O | V-O | V-O | V-O | V-O | V-O |

TABLE 4

| | Comparative Example | | | | | | | | | |
|---|---|---|---|---|---|---|---|---|---|---|
| | 14 | 15 | 16 | 17 | 18 | 19 | 20 | 21 | 22 | 23 |
| Biphenyl type epoxy resin | 4.78 | 4.78 | 4.82 | 4.77 | 4.90 | 4.75 | 4.75 | 4.78 | 4.75 | 4.75 |
| Bisphenol A type epoxy resin | | | | | | | | | | |
| Cresol novolac type epoxy resin | | | | | | | | | | |
| Phenolaralkyl resin | 4.27 | 4.27 | 4.30 | 4.27 | 4.40 | 4.25 | 4.25 | 4.27 | 4.25 | 4.25 |
| Phenol novolac resin | | | | | | | | | | |
| Phenol biphenylaralkyl resin | | | | | | | | | | |
| Spherical fused silica | 90.00 | 90.00 | 90.00 | 90.00 | 90.00 | 90.00 | 90.00 | 90.00 | 90.00 | 90.00 |
| γ-Glycidylpropyltrimethoxysilane | 0.30 | | 0.30 | 0.30 | | 0.30 | 0.30 | 0.30 | 0.30 | 0.30 |
| γ-Mercaptopropyltrimethoxysilane | | 0.30 | | | | | | | | |
| Triphenylphosphine | 0.15 | 0.15 | 0.08 | 0.15 | 0.15 | 0.15 | 0.15 | | | |
| DBU | | | | | | | | 0.15 | | |
| Curing accelerator of formula (6) | | | | | | | | | 0.20 | |
| Curing accelerator of formula (7) | | | | | | | | | | 0.20 |
| 2,3-Dihydroxynaphthalene | | | | 0.008 | 0.05 | | | | | |
| 1,2-Dihydroxynaphthalene | | | | | | | | | | |
| Catechol | | | | | | | | | | |
| Pyrogallol | | | | | | | | | | |
| 1,6-Dihydroxynaphthalene | | | | | | 0.05 | | | | |
| Resorcinol | | | | | | | 0.05 | | | |
| Carnauba wax | 0.20 | 0.20 | 0.20 | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 | 0.30 | 0.30 | 0.30 |
| Spiral flow (cm) | 65 | 68 | 120 | 69 | 66 | 67 | 66 | 68 | 79 | 82 |
| Curing torque ratio (%) | 65 | 64 | 10 | 65 | 59 | 65 | 64 | 58 | 95 | 88 |
| Solder resistance-cracking  Chip delamination | 3 | 2 | Poor releasing | 2 | 8 | 4 | 3 | 3 | 2 | 4 |
| Internal crack | 0 | 0 | | 0 | 0 | 0 | 0 | 0 | 0 | 0 |
| Fire retardancy | V-O | V-O | | V-O | V-O | V-O | V-O | V-O | V-O | V-O |

What is claimed is:

1. A resin composition for encapsulating a semiconductor chip comprising:
   an epoxy resin (A);
   a phenol resin (B);
   an inorganic filler (C);
   a curing accelerator (D);
   a silane coupling agent (E); and
   Compound (F) containing two or more hydroxyl groups combined with each of adjacent carbon atoms comprising an aromatic rings,
   wherein the epoxy resin (A) is a member selected from the group consisting of phenol novolac type epoxy resins, cresol novolac type epoxy resins, biphenyl type epoxy resins, bisphenol type epoxy resins, stilbene type epoxy resins, triphenolmethane type epoxy resins, phenolaralkyl (including a phenylene or biphenylene structure) type epoxy resins, naphthol type epoxy resins, alkyl-modified triphenolmethane type epoxy resins, triazine-structure containing type epoxy resins, dicyclopentadiene-modified phenol type epoxy resins, and mixtures thereof.

2. The resin composition for encapsulating a semiconductor chip according to claim 1, wherein said compound (F) is present in an amount more than or equal to 0.01 wt %.

3. The resin composition for encapsulating a semiconductor chip according to claim 1, wherein the resin composition comprises said silane coupling agent (E) in an amount of 0.01 wt % to 1 wt % both inclusive.

4. The resin composition for encapsulating a semiconductor chip according to claim 1, wherein said Compound (F) contains two hydroxyl groups combined with each of adjacent carbon atoms comprising said aromatic ring.

5. The resin composition for encapsulating a semiconductor chip according to claim 1, wherein the aromatic ring is a naphthalene ring.

6. The resin composition for encapsulating a semiconductor chip according to claim 5, wherein said Compound (F) contains two hydroxyl groups combined with each of adjacent carbon atoms comprising said naphthalene ring.

7. The resin composition for encapsulating a semiconductor chip according to claim 1, wherein the resin composition comprises said inorganic filler (C) in an amount of 80 wt % to 94 wt % both inclusive.

8. A semiconductor device wherein a semiconductor chip is encapsulated by the resin composition according to claim 1.

9. A resin composition for encapsulating a semiconductor chip comprising:
   an epoxy resin (A);
   a phenol resin (B);

an inorganic filler (C);
a curing accelerator (D);
a silane coupling agent (E); and
Compound (F) containing two or more hydroxyl groups combined with each of adjacent carbon atoms comprising an aromatic ring;
wherein said epoxy resin (A) comprises an epoxy resin represented by general formula (1):

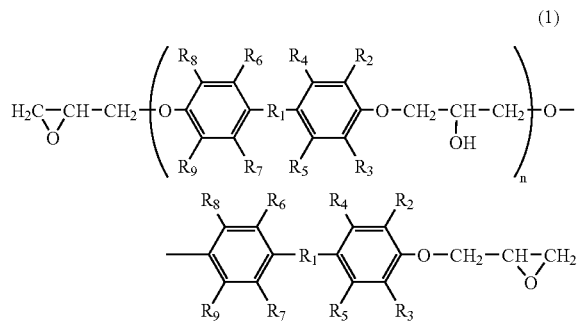

wherein $R_1$ represents a single bond or saturated or unsaturated hydrocarbon having up to three carbon atoms; $R_2$ to $R_9$, which may be the same or different from each other, represent hydrogen or saturated hydrocarbon having up to four carbon atoms; and n is a positive number more than 0 and up to 5 as an average, in 50 wt % or more.

10. The resin composition for encapsulating a semiconductor chip according to claim 9, wherein said Compound (F) contains two hydroxyl groups combined with each of adjacent carbon atoms comprising said aromatic ring.

11. The resin composition for encapsulating a semiconductor chip according to claim 9, wherein the aromatic ring is a naphthalene ring.

12. The resin composition for encapsulating a semiconductor chip according to claim 11, wherein said Compound (F) contains two hydroxyl groups combined with each of adjacent carbon atoms comprising said naphthalene ring.

13. The resin composition for encapsulating a semiconductor chip according to claim 9, wherein the resin composition comprises said inorganic filler (C) in an amount of 80 wt % to 94 wt % both inclusive.

14. A semiconductor device wherein a semiconductor chip is encapsulated by the resin composition according to claim 9.

* * * * *